United States Patent [19]

Kobayashi et al.

[11] Patent Number: 5,422,765

[45] Date of Patent: * Jun. 6, 1995

[54] INVERTER DEVICE ATTENUATING IN-PHASE HARMONIC COMPONENTS OF AN OSCILLATING OUTPUT SIGNAL

[75] Inventors: Eiji Kobayashi; Akira Egawa, both of Minamitsuru, Japan

[73] Assignee: Fanuc Ltd., Minamitsuru, Japan

[*] Notice: The portion of the term of this patent subsequent to Mar. 19, 2008 has been disclaimed.

[21] Appl. No.: 776,858

[22] Filed: Oct. 16, 1991

Related U.S. Application Data

[63] Continuation of Ser. No. 571,646, filed as PCT/JP90/00027, Jan. 10, 1990, published as WO 90/09056, Aug. 9, 1990, abandoned.

[30] Foreign Application Priority Data

Jan. 24, 1989 [JP] Japan .................. 1-14626

[51] Int. Cl.⁶ .................................. H02M 1/12
[52] U.S. Cl. .......................... 363/40; 363/17; 363/132
[58] Field of Search .................. 363/16-17, 363/20-21, 24-26, 39-40, 47-48, 131-132, 134

[56] References Cited

U.S. PATENT DOCUMENTS

| | | | |
|---|---|---|---|
| 4,092,710 | 5/1978 | Wadsworth | 363/19 |
| 4,104,715 | 8/1978 | Lawson | 363/37 |
| 4,683,529 | 7/1987 | Bucher | 363/44 |
| 4,734,841 | 3/1988 | Elliott et al. | 363/21 |
| 4,811,192 | 3/1989 | Egawa | 363/132 |
| 4,849,950 | 7/1989 | Sugiura et al. | 363/48 |
| 4,855,891 | 8/1989 | Paul | 363/40 |
| 4,860,184 | 8/1989 | Tabisz et al. | 363/17 |
| 4,864,479 | 9/1989 | Steigerwald et al. | 363/132 |
| 4,888,675 | 12/1989 | Kumar et al. | 363/47 |
| 4,890,216 | 12/1989 | Egawa | 363/124 |
| 4,939,381 | 7/1990 | Shibata et al. | 363/17 |
| 4,943,886 | 7/1990 | Quazi | 363/37 |
| 4,967,332 | 10/1990 | Claydon et al. | 363/132 |
| 5,001,621 | 3/1991 | Egawa | 363/132 |

FOREIGN PATENT DOCUMENTS

| | | | |
|---|---|---|---|
| 0186524 | 11/1987 | European Pat. Off. | H02M 1/14 |
| 2146497 | 4/1985 | United Kingdom | H02M 1/12 |

*Primary Examiner*—Jeffrey L. Sterrett
*Attorney, Agent, or Firm*—Staas & Halsey

[57] ABSTRACT

An inverter device receives a D.C. power source as an input and performs a switching operation at a single frequency in response to a preset driving signal (Vg1, Vg2, Vg3, Vg4) to produce an A.C. voltage. A transmission transformer (CH) having two coils which have the same inductance and are magnetically closely coupled with each other is provided and the two coils (CH1, CH2) are connected with the same polarities to respective ones of one set of lines for transmitting the A.C. voltage. The impedance of the transmission transformer (CH) is so small that it is negligible with respect to a normal A.C. voltage of a positive phase mode. A harmonic voltage is in an in-phase mode and the transmission transformer (CH) exhibits an extremely high impedance with respect to the harmonic voltage, and thus prevents the creation of a current path. As a result, the waveform distortion of a voltage applied between the drain and source of MOS transistors (FET1, FET2, FET3, FET4) is reduced and the peak value is reduced.

1 Claim, 5 Drawing Sheets

INVERTER DEVICE ATTENUATING IN-PHASE HARMONIC COMPONENTS OF AN OSCILLATING OUTPUT SIGNAL

This application is a continuation, of application Ser. No. 07/571,646, filed as PCT/JP90/00027, Jan. 10, 1990, published as WO 90/09056, Aug. 9, 1990, now abandoned.

BACKGROUND OF THE INVENTION

1. Field of the Invention

This invention relates to an inverter device for converting a D.C. power to A.C. power by switching a MOS transistor to produce the output A.C. power and more particularly, to an inverter device capable of eliminating harmonic components of in-phase mode which are otherwise superposed on an oscillating output voltage.

This invention can be used as a power source for high-frequency discharge pumping $CO_2$ gas laser devices, high-frequency induction heating furnaces, or the like.

2. Description of the Related Art

Conventionally, an inverter device constructed to convert D.C. power to A.C. power of a desired frequency, using a switching MOS transistor and for output is used as a power source for high-frequency discharge pumping $CO_2$ gas laser devices and high-frequency induction heating furnaces.

A MOS transistor has a relatively large output capacitor existing between the drain and source thereof. This output capacitor is parasitically created when the transistor is formed and causes a power loss when a high-frequency operation is effected, and further, resonates with the inductance of a wiring to generate harmonics. These harmonics are transmitted via a stray capacitor between the drain of MOS transistor and the ground and a stray capacitor between the primary and secondary windings of a matching insulating transformer connected between the MOS transistor and the load; i.e., the harmonics are superposed on the output A.C. voltage in the in-phase mode.

As a result, the peak value of a voltage waveform applied between the drain and source of the MOS transistor is raised and the input D.C. voltage level is limited, making it impossible to derive a sufficient output power.

SUMMARY OF THE INVENTION

This invention has been made in view of the above fact, and an object thereof is to provide an inverter device which is small and can eliminate harmonic components of an in-phase mode which are otherwise superposed on an oscillating output voltage, and generate a high power at a high efficiency.

To solve the above problem, in this invention, there is provided an inverter device which comprises one set of input terminals connected to a D.C. power source, one set of output terminals connected to a load, an inductance element connected in series with at least one of the input terminals, at least one MOS (metal-oxide-semiconductor) transistor connected in series with the induction element and the other of the input terminals, for effecting a switching operation at a single frequency in response to a preset driving signal to output an A.C. voltage, and an insulating transformer for insulating a direct current component of the A.C. output voltage and outputting the same to the output terminals. A transmission transformer having two coils, which have the same inductance and are magnetically closely coupled with each other, is provided and the two coils of the transmission transformer are connected with the same polarities to respective ones of one set of lines for transmitting the A.C. voltage. The transmission transformer may be located between the insulating transformer and the output terminals or between the insulating transformer and the at least one MOS transistor.

The impedance of the transmission transformer is so small that it is negligible with respect to a normal A.C. voltage of positive phase mode, but the harmonic voltage is in the in-phase mode and the transmission transformer exhibits an extremely high impedance with respect to the harmonic voltage and prevents the creation of a current path. As a result, the waveform distortion of a voltage applied between the drain and source of the MOS transistor is reduced and the peak value is reduced.

BEST MODE OF CARRYING OUT THE INVENTION

An embodiment of this invention will now be described with reference to the accompanying drawings.

Figure 1:
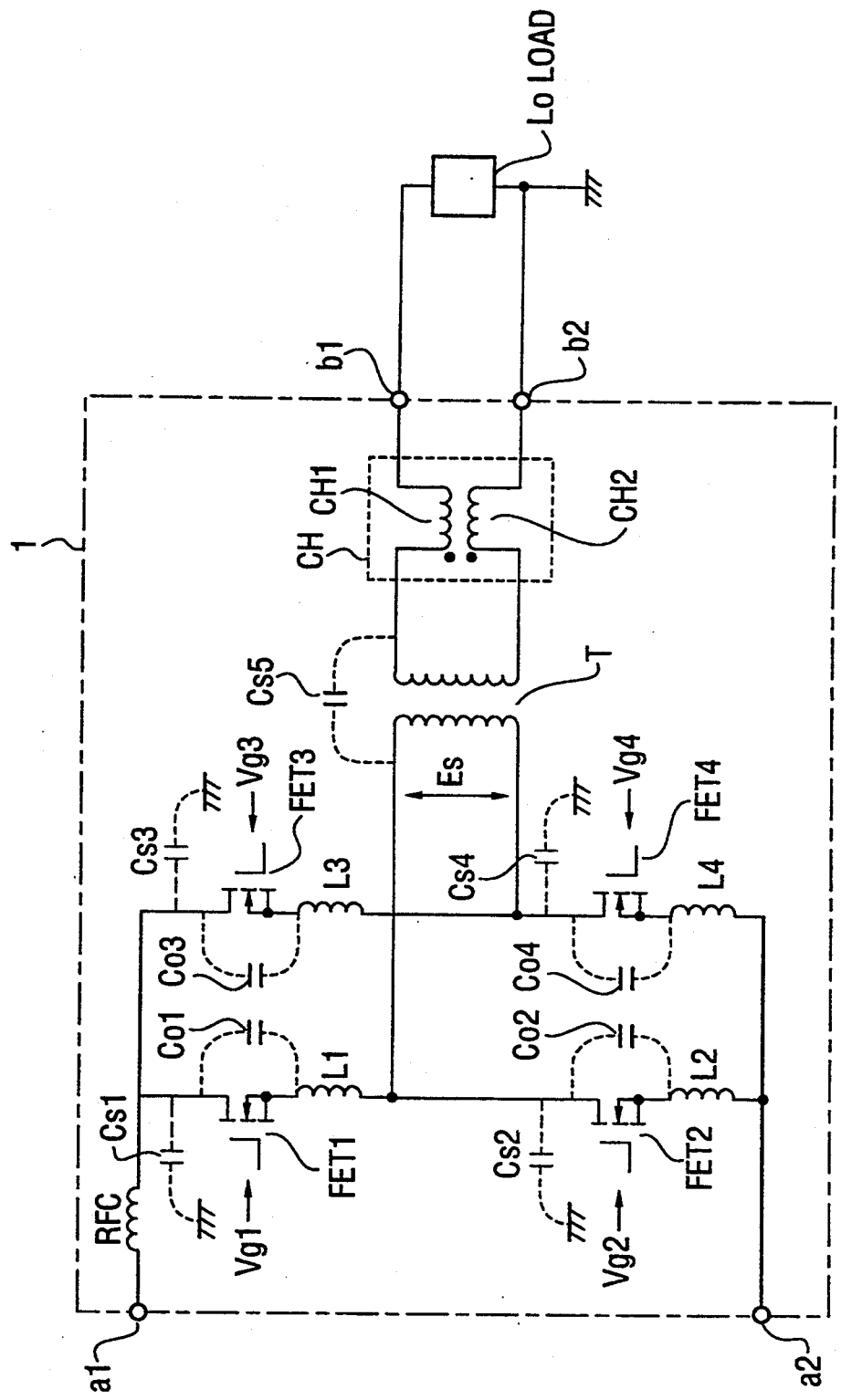
FIG. 1 is a circuit diagram of an inverter device according to one embodiment of this invention.

FIG. 1 is a circuit diagram of an inverter device according to one embodiment of this invention. In FIG. 1, a D.C. power source is connected to input terminals a1 and a2 of an inverter device 1, to supply a preset D.C. voltage to N-channel MOS transistors FET1 to FET4 via a choke coil RFC. The MOS transistors are fixed on a heat sink connected to ground via an insulative film. The base portions of the MOS transistors correspond to drains, and therefore, stray capacitors Cs1 to Cs4 exist between the drains and ground.

The respective gates of the MOS transistors FET1 to FET4 are supplied with driving signals Vg1 to Vg4. The driving signals Vg1 and Vg4 are the same signal and the driving signals Vg2 and Vg3 are the same signal, and the two types of driving signals are shifted in phase from each other by 180°. With this arrangement, the MOS transistors FET1 and FET4 and the MOS transistors FET2 and FET3 are alternately turned on and off to generate a harmonic A.C. voltage Es, permitting a current to flow in a load Lo connected to output terminals b1 and b2 via an insulating transformer T and a transmission transformer CH. The load Lo maybe a discharge tube of a high-frequency discharge pumping $CO_2$ gas laser, a high-frequency induction heating furnace, or the like.

On the other hand, a harmonic voltage Eh of an in-phase mode (not shown) is generated at each switching operation by output capacitors Co1 to Co4 of the MOS transistors FET1 to FET4 and inductances L1 to L4 of wiring.

In this case, coils CH1 and CH2 of the transmission transformer CH have the same inductance and are magnetically closely coupled with each other and inserted into the lines with the same polarities. Therefore, the impedance thereof is so small that it is negligible with respect to a voltage of the positive phase mode but is extremely high with respect to a voltage of the in-phase mode.

Figure 2A:
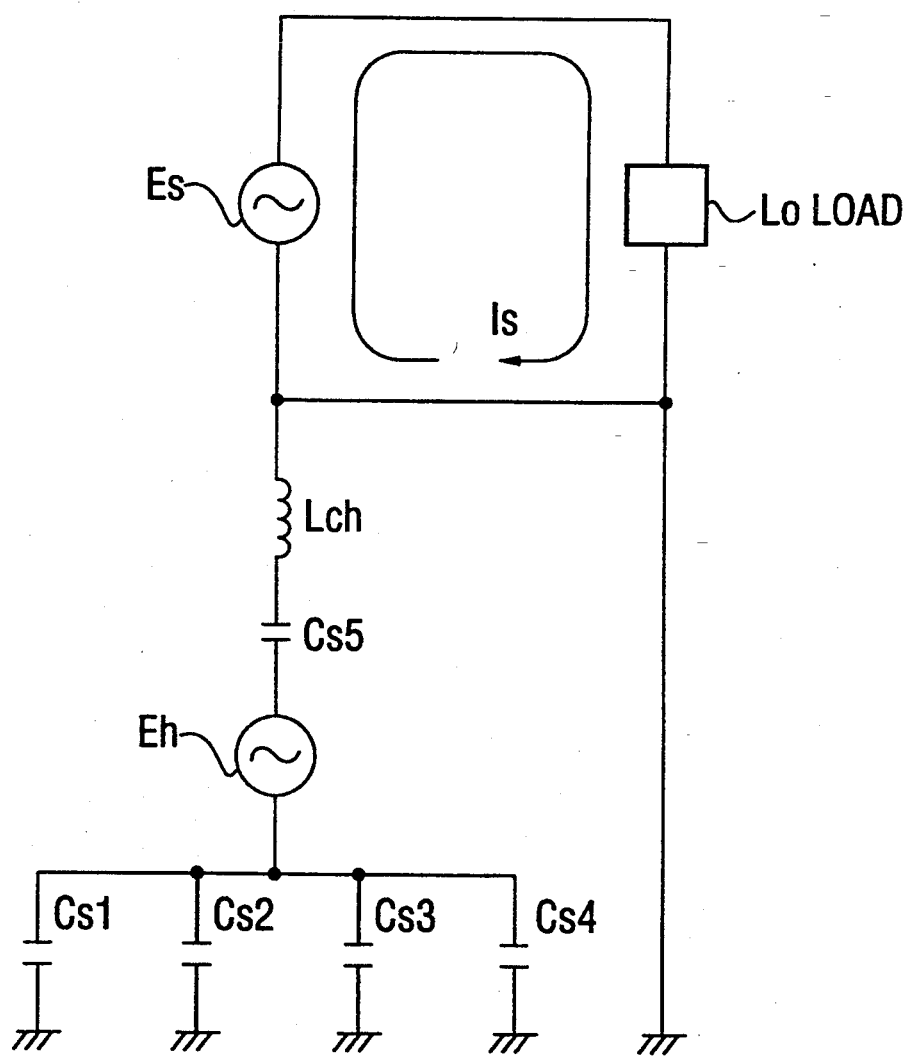
FIGS. 2A and 2B are equivalent circuit diagrams of inverter devices according to embodiment of this invention.
Figure 2B:
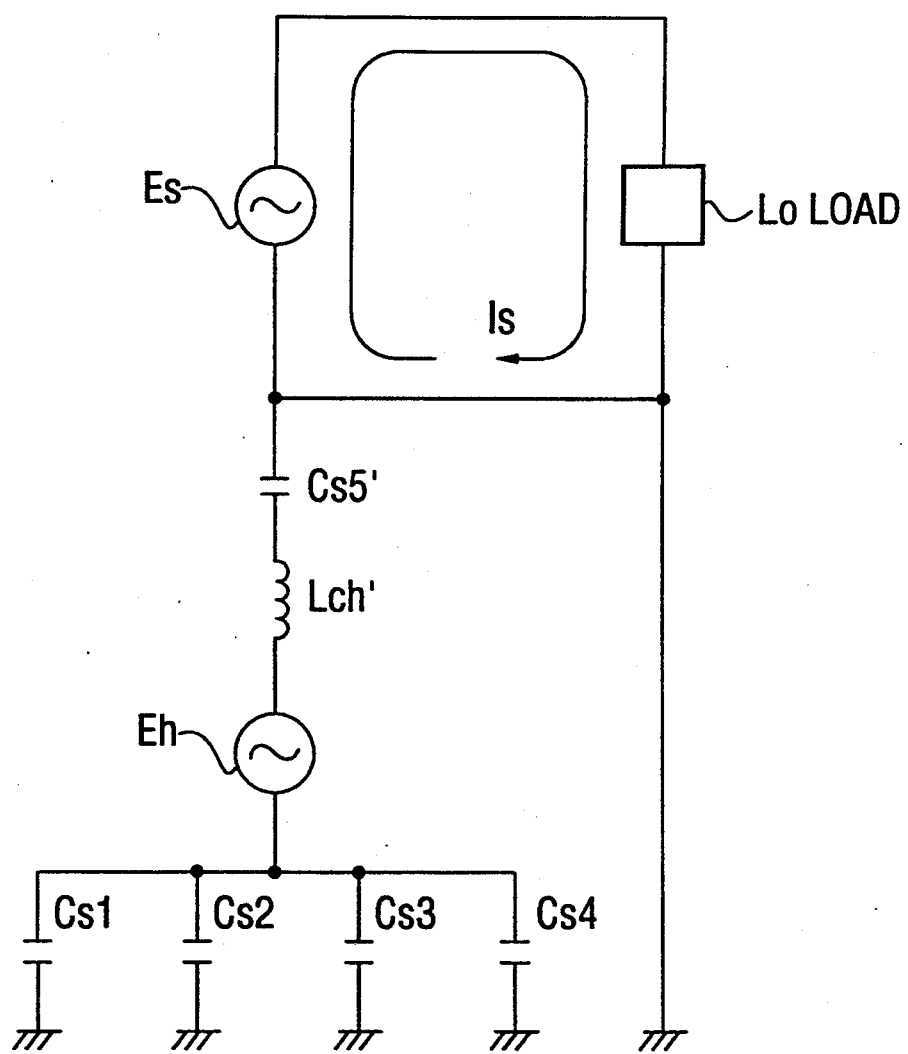

The relationship between the A.C. voltage Es and the harmonic voltage Eh is explained with reference to the equivalent circuits shown in FIG. 2A and 2B. In these drawings, various constants such as impedance and resistors in the positive phase mode are omitted. In both FIGS. 2A and 2B, the A.C. voltage Es is applied to the load Lo, permitting a current Is to flow. The only difference between the embodiments illustrated in FIGS. 2A and 2B is the order of the insulating transformer represented by stray capacitor Cs5 and the transmission transformer represented by inductance Lch.

The harmonic voltage Eh is coupled to a current path of the A.C. voltage Es via a parallel circuit of the stray capacitors Cs1 to Cs4 of the MOS transistors FET1 to FET4, and a series circuit of stray capacitor Cs5 between the primary and secondary windings of the insulating transformer T and an inductance Lch of the transmission transformer for the in-phase mode.

Nevertheless, as described before, since the value of the inductance Lch is extremely large, in practice a current due to the harmonic voltage Eh does not flow. Namely, the harmonic voltage Eh is not superposed on the A.C. voltage Es.

Figure 3:
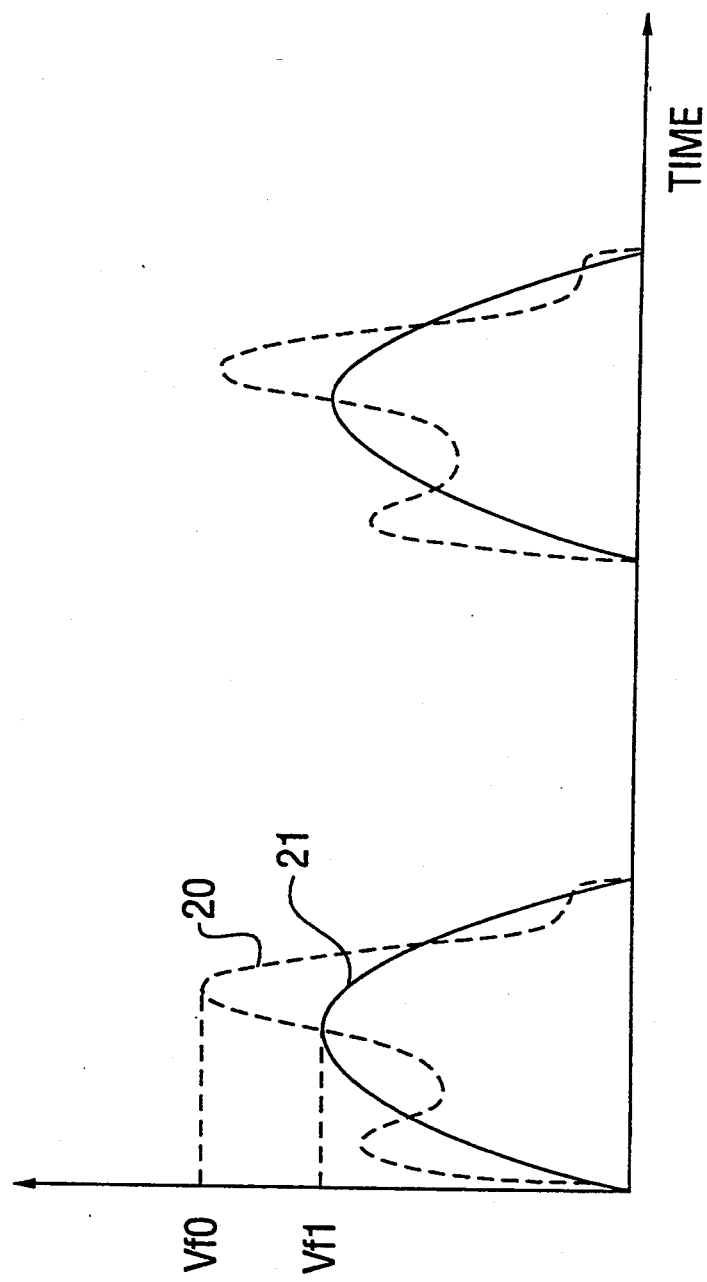
FIG. 3 is a diagram showing the waveform of a voltage applied between the drain and source of a MOS transistor.

FIG. 3 is a graph showing the waveform of a voltage between the drain and source of the MOS transistor. In FIG. 3, 20 denotes a voltage waveform which is obtained in the conventional inverter device and on which a harmonic of in-phase mode is superposed. In contrast, a voltage waveform 21 obtained in the inverter device according to one of the embodiments of this invention is substantially a sinusoidal wave, and the peak value Vf1 of the voltage waveform is lowered to approx. ¾ of the peak value Vf0 of the voltage waveform 20.

Therefore, it becomes possible to raise the input D.C. voltage level in comparison with the prior art case, permitting a larger output power to be produced.

Figure 4:
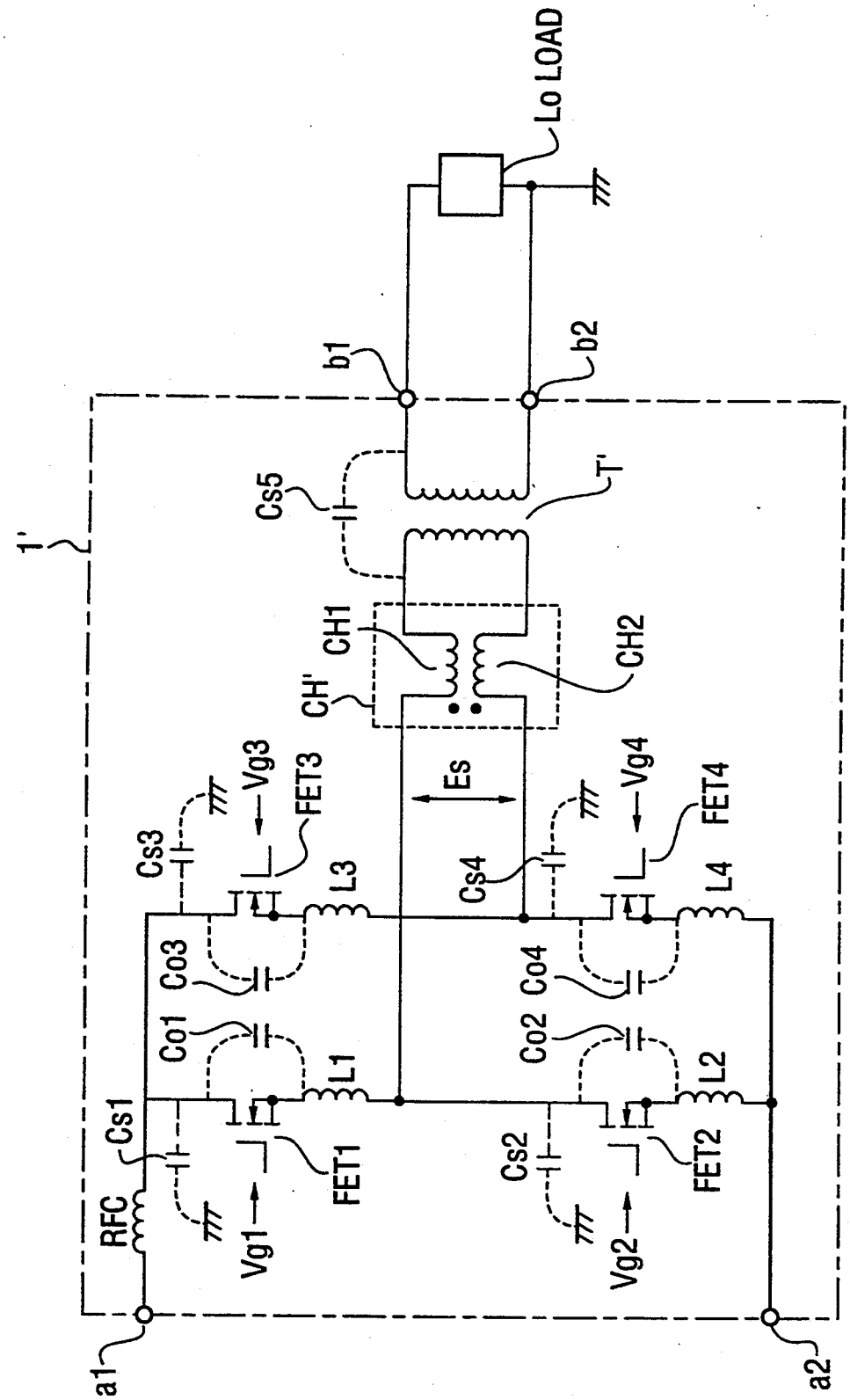
FIG. 4 is a circuit diagram of an alternate embodiment.

In FIGS. 1 and 2A, the transmission transformer CH is connected between the secondary side of the insulating transformer T and the load Lo, but it is also possible to connect a transmission transformer CH between the MOS transistors Fet1–Fet4 and the primary side of an insulating transformer T' as illustrated in FIGS. 2B and 4, to reduce the peak value of the waveform of the voltage between the drain and source of the MOS transistor in the same manner as described above.

As described above, according to this invention, since the transmission transformer is connected to the lines for transmitting an A.C. voltage, to exhibit a high impedance only for the in-phase mode current, harmonics will not be superposed on the A.C. voltage and the peak value of a voltage applied between the drain and source of the MOS transistor(s) is reduced. As a result, the input D.C. voltage level can be raised in comparison with the conventional case, to thereby enhance the output and efficiency of the inverter device.

We claim:
1. An apparatus for driving a gas laser, comprising:
   first and second input terminals connected to a direct current power source;
   one set of output terminals connected to the gas laser;
   an inductance element connected in series with said first input terminal;
   at least one metal-insulator-semiconductor transistor connected in series with said inductance element and said second input terminal, for effecting a switching operation at a single frequency in response to a preset driving signal to output an alternating current voltage;
   an insulating transformer, operatively connected between said at least one metal-insulator-semiconductor transistor and said output terminals, for insulating a direct current component of the alternating current output voltage; and
   a transmission transformer, having two coils with substantially identical inductance, identical polarities and magnetically closely coupled with each other, said transmission transformer connected in series with said insulating transformer for transmitting the alternating current voltage to said output terminals.

* * * * *